United States Patent [19]
Giannella

[11] Patent Number: 5,190,884
[45] Date of Patent: Mar. 2, 1993

[54] METHOD OF MAKING VERTICAL PNP TRANSISTOR

[75] Inventor: Giovanni P. Giannella, Saratoga, Calif.

[73] Assignee: Exar Corporation, San Jose, Calif.

[21] Appl. No.: 852,775

[22] Filed: Mar. 17, 1992

Related U.S. Application Data

[62] Division of Ser. No. 644,019, Jan. 18, 1991, Pat. No. 5,097,309.

[51] Int. Cl.$^5$ .................... H01L 21/265; H01L 29/70
[52] U.S. Cl. ........................................ 437/31; 437/26; 148/DIG. 10; 148/DIG. 11
[58] Field of Search ...................... 437/31, 26; 357/34, 357/68, 90; 148/10, 11

[56] References Cited

U.S. PATENT DOCUMENTS

| | | | |
|---|---|---|---|
| 3,925,120 | 12/1975 | Saida et al. ........................... | 148/175 |
| 4,151,540 | 4/1979 | Sander et al. ......................... | 357/34 |
| 4,404,738 | 9/1983 | Sasaki et al. ......................... | 437/31 |
| 4,826,780 | 5/1989 | Takemoto et al. ................... | 437/31 |
| 4,949,150 | 8/1990 | Giannella ............................. | 357/44 |
| 4,985,741 | 1/1991 | Bauer et al. .......................... | 357/34 |
| 5,097,309 | 3/1992 | Giannella ............................. | 357/34 |

Primary Examiner—Olik Chaudhuri
Assistant Examiner—Long Pham
Attorney, Agent, or Firm—Limbach & Limbach

[57] ABSTRACT

A vertical PNP transistor for use in an integrated circuit is disclosed. A P-type substrate serves as collector. An N-type epitaxial layer is formed on the substrate and serves as base. A P-type region is formed in the epitaxial layer and serves as emitter. An N+-type localized buried layer is formed on the substrate in the area beneath the emitter. The localized buried layer covers less than all of the area under the emitter. An N+-type sinker region is formed through the epitaxial layer, connecting to the localized buried layer and serving as a connection to the base of the vertical PNP transistor.

6 Claims, 7 Drawing Sheets

METHOD OF MAKING VERTICAL PNP TRANSISTOR

This is a divisional of application Ser. No. 07/644,019, filed Jan. 18, 1991, now, U.S. Pat. No. 5,097,309.

BACKGROUND

1. Field of the Invention

The present invention relates to a vertical PNP transistor structure for use in integrated circuits.

2. Discussion of the Prior Art

In the integrated circuit art, vertical PNP transistors are well known. Referring to FIGS. 1a and 1b, a conventional vertical PNP transistor is shown formed on a P-type substrate 10 which acts as the collector. An N-type epitaxial layer 12 is grown on top of the substrate 10 and acts as the base. A deep P-type isolation region 14 may be formed in the epitaxial layer 12 extending to the substrate 10 to create an isolated epitaxial "tub" containing the transistor device. A P-type region 16 is formed in the epitaxial layer 12 and acts as the emitter, providing a P-N junction between the emitter 16 and base 12. An N+-type region 18 is formed in the epitaxial layer 12 to provide good ohmic contact with the base region.

In such a conventional vertical PNP transistor structure, the effective base is the vertical region of the epitaxial layer 12 located directly below the emitter 16 Because of the physical separation between the base contact 18 and the active base region 12', there is a transverse resistance R between the base contact 18 and the active base region 12' which affects the performance of the device. The value of such resistance increases with distance from the base contact 18. Therefore, there is a voltage drop along the active base region 12' which increases as base drive to the transistor increases.

It is well known in conventional vertical PNP transistor structures that the collector current varies exponentially with the voltage applied to the base, such that a voltage drop of about 60 mV across the active base region 12' causes a ten-fold decrease in collector current. When the base current increases enough to generate a voltage drop in the range of 10-20 mB, the active region 12' becomes less efficient and its contribution to the collector current becomes lower. Thus, at very low levels of base current (microamps range), the entire area under the emitter is efficient and contributes uniformly to the collector current. At higher levels of base current, however, the active region 12' is narrowed down to where the voltage drop is below 20 mV. This phenomenon, called base debiasing, is shown in FIG. 1c and is the reason why the gain of a vertical PNP transistor decreases as base current, and consequently collector, current, increases. Typically, the gain ranges from 100-400 at currents below 1-2 milliamps, but decreases to 10-30 at 10 milliamps. Thus, in a conventional vertical PNP structure, base drive levels of a few microamps have resulted in significant degradation in performance of the transistor and adversely affected the overall gain of the transistor at milliamp levels of collector current.

In another conventional vertical PNP configuration, shown in FIGS. 2a and 2b, the N+ base contact region 18a fully surrounds an emitter 16a having a larger area than in FIGS. 1a and 1b. Base drive current capability is improved over the structure of FIGS. 1a and 1b, since the distance to the active base region 12' is decreased and the transverse resistance R' is less.

These conventional structures exhibit adequate current gain for small base drive current levels (up to approximately 10 microamps). At higher levels, however, gain decreases rapidly due to the high base resistance. Where higher current levels are required, several vertical PNP transistors have been used in parallel. However, multiple transistors require a large area on the die, rendering such structures costly and less desirable.

SUMMARY OF THE INVENTION

A vertical PNP transistor structure is presented. A P-type substrate serves as a collector. An N-type epitaxial layer is formed on the substrate and serves as a base. A P-type isolation region is formed in the epitaxial layer and extends down to the substrate to create a tub. A P-type region is formed in the epitaxial layer and serves as an emitter. An N+-type localized buried layer is formed on the substrate in the area beneath the emitter. The localized buried layer covers less than all of the area under the emitter. A deep N+-type region is formed in the epitaxial layer, connecting to the localized buried layer and serving as a low resistance current path to the base contact of the vertical PNP transistor.

The addition of the two N+-type regions reduces the base resistance. The deep N+ region decreases the vertical component and the localized buried layer decreases the horizontal component. Both of these regions have very high dopant concentrations relative to the epitaxial layer, thus presenting a very low resistive path to the base current.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIG. 4b is a sectional view taken across section A—A of FIG. 3a.

DESCRIPTION OF THE PREFERRED EMBODIMENT

As a preliminary note, conventional techniques are used for all formation steps discussed below, i.e., formation of an oxide layer, photoresist masking to crease a window(s) through the oxide layer to the underlying surface, diffusion or ion implantation through the windows, etching away the oxide layer, and repeating for as many formations as are required by the circuit, such that these techniques are considered widely known and are implicit in the descriptions.

Figure 1A:
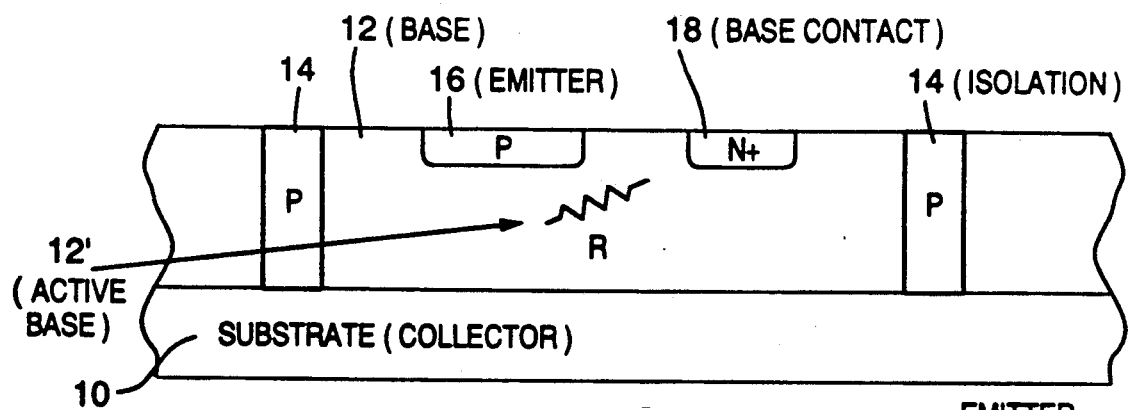
FIG. 1a is a sectional view of a prior art structure for a vertical PNP transistor.
Figure 1B:
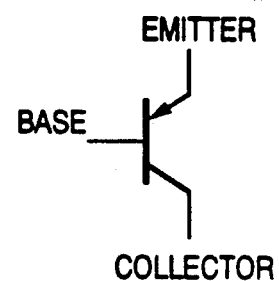
FIG. 1b is a top plan view of a prior art structure for a vertical PNP transistor.
Figure 1B:
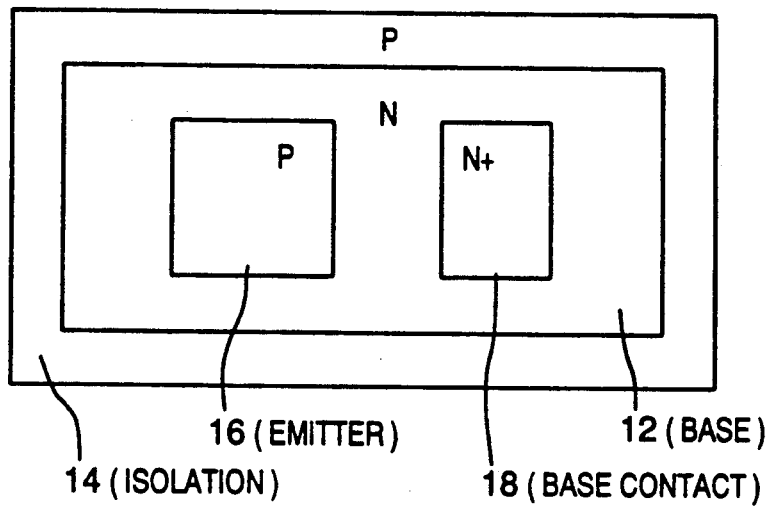
Figure 1C:
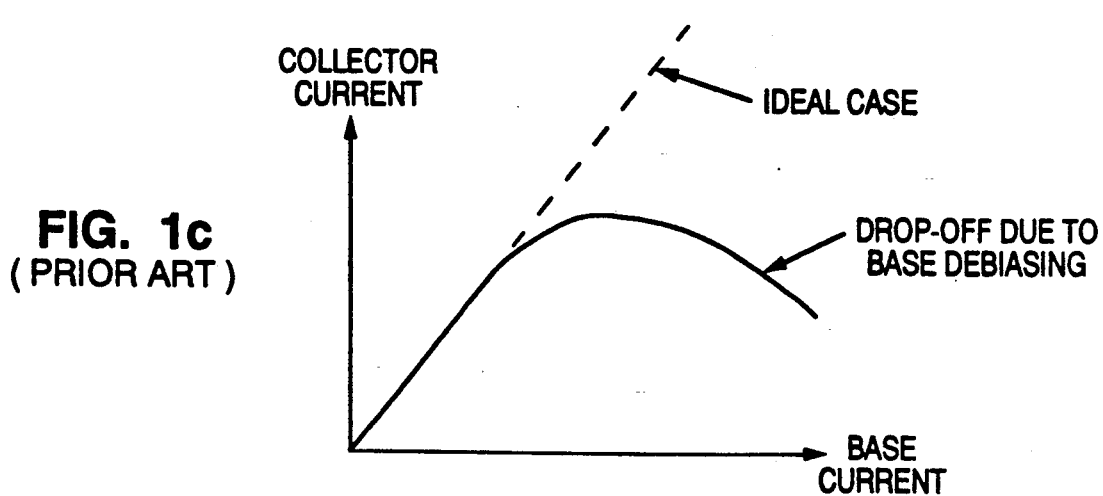
FIG. 1c is a graph of base current vs. collector current in the transistor of FIGS. 1a and 1b.
Figure 2A:
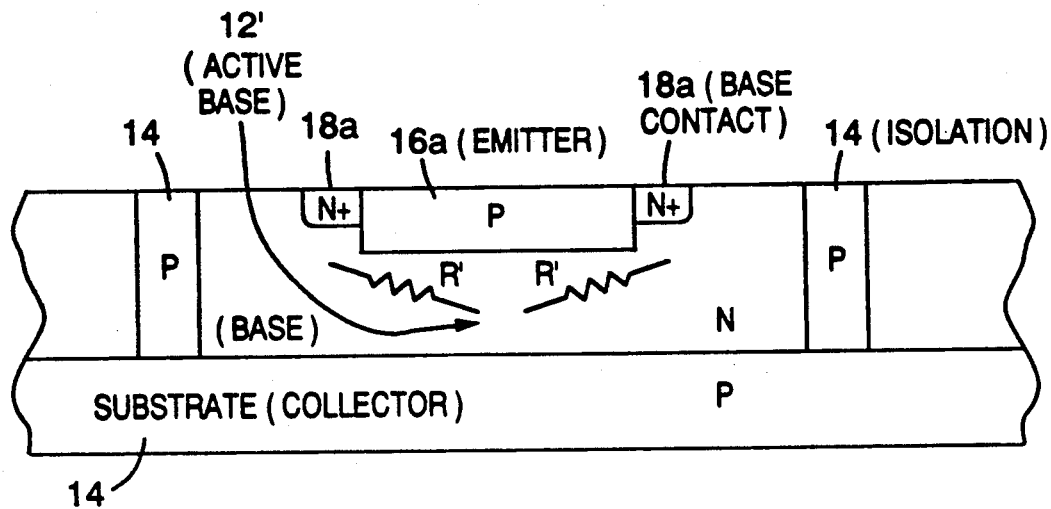
FIG. 2a is a sectional view of a prior art structure for a vertical PNP transistor.
Figure 2B:
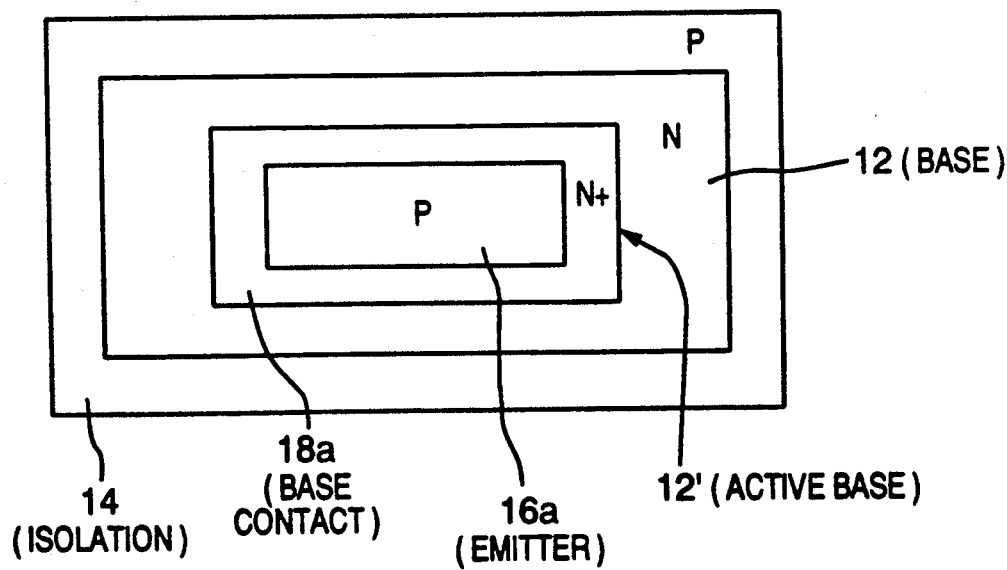
FIG. 2b is a top plan view of a prior art structure for a vertical PNP transistor.
Figure 3A:
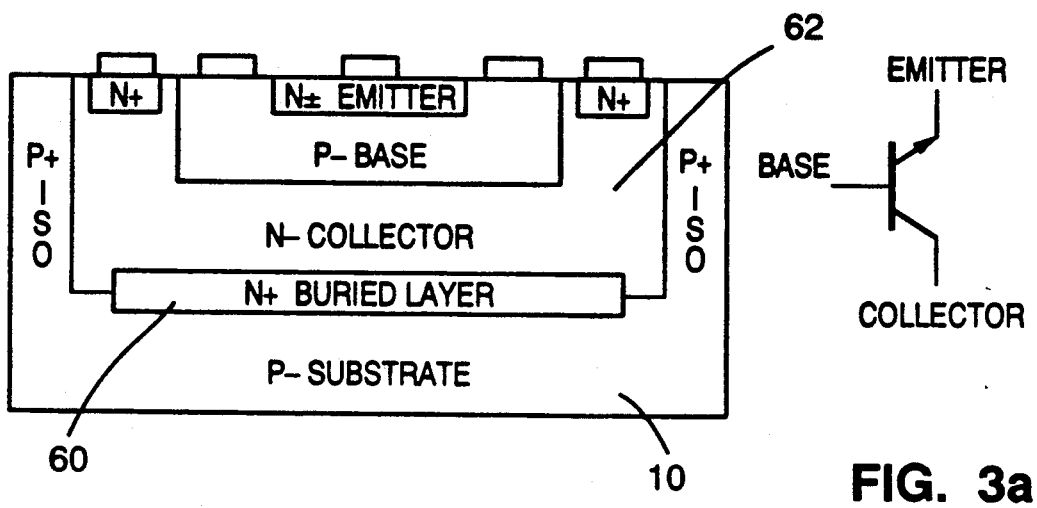
FIG. 3a is a sectional view of a prior art structure for a vertical NPN transistor.
Figure 3B:
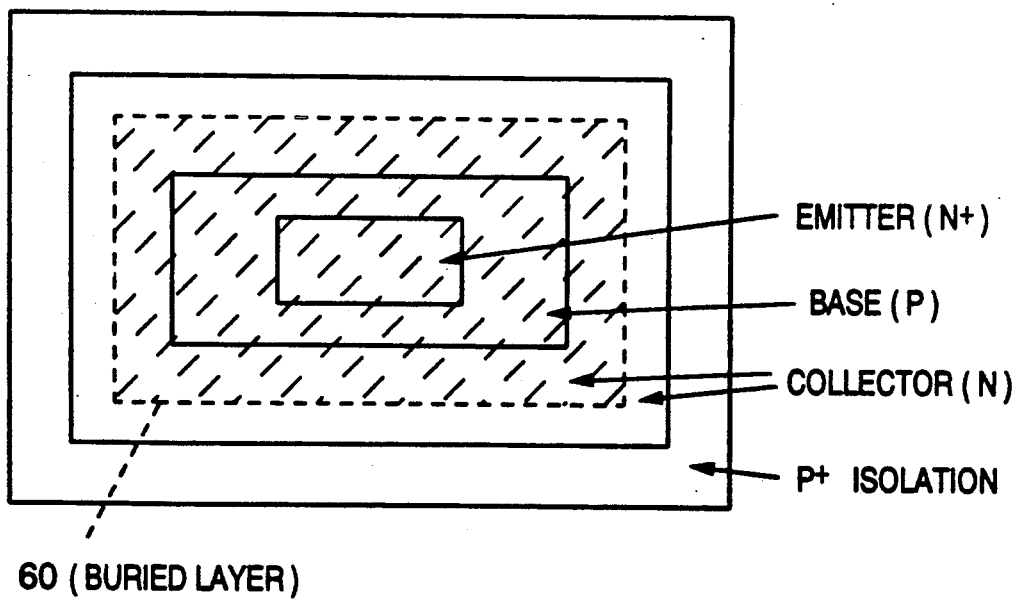
FIG. 3b is a top plan view of a prior art structure for a vertical NPN transistor.
Figure 4A:
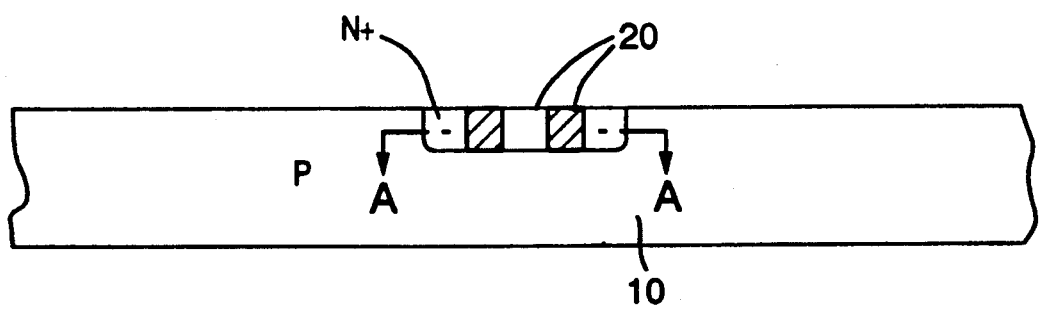
FIG. 4a is a sectional view of a step in the fabrication of a vertical PNP transistor according to the present invention.
Figure 4B:
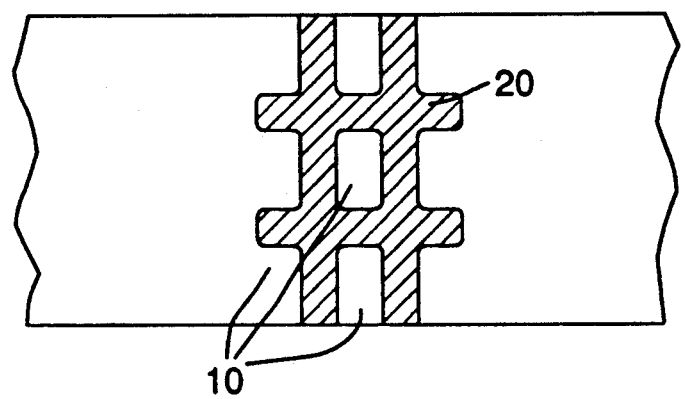
Figure 4C:
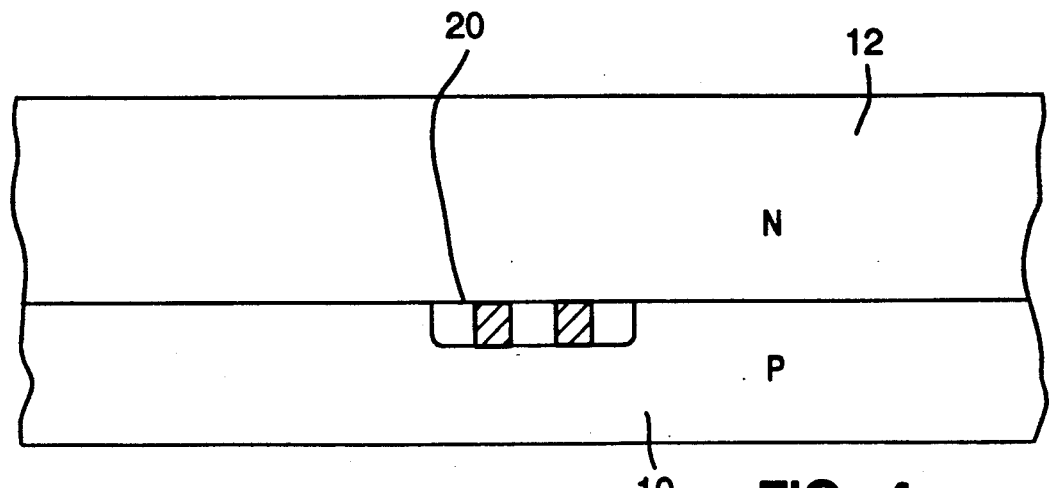
FIG. 4c-f are sectional views of steps in the fabrication of a vertical PNP transistor according to the present invention.

Referring now to FIGS. 4a-4c, a P-type substrate 10 serves as a collector. An N+-type localized buried layer 20 is formed in substrate 10. It is to be understood that the term "localized buried layer" is used herein to distinguish the buried layer of the present invention from the buried layers that are typically used in conventional vertical NPN transistor structures, such as that shown in FIG. 3a and 3b. There, the buried layer 60 is a unitary body sandwiched between the collector region 62 and the substrate 10 in order to reduce collector series resistance. In accordance with the present invention, the "localized buried-layer" is positioned under the emitter and occupies an area which is less than the area of the emitter.

In Giannella U.S. Pat. No. 4,949,150 a vertical PNP structure is shown in (FIG. 4a) which does not use a buried layer under the emitter. FIG. 4a does show an N+ diffusion 94 to buried layer 96 coupled to the epitaxial layer 86 to form the base of the transistor. Also shown (FIG. 3a) is a structure which may be used as a vertical NPN transistor (FIG. 3a) or a lateral PNP transistor (FIG. 3c). In the NPN configuration, the buried layer is used to reduce the ohmic resistance of the collector. The buried layer has a concentration about one thousand times higher than the epitaxial layer, so it can offer a low resistance path to the collector current.

In the lateral PNP configuration, however, the buried layer is used to decrease substantially the parasitic vertical PNP transistor which is formed by the emitter of the lateral PNP, the epitaxial layer acting as base, and the substrate acting as collector. The high concentration of the buried layer causes the recombination of the current injected vertically and the majority of the emitter current is collected by the top collector. For this reason, it is common practice in the construction of lateral PNP transistors to use a buried layer under all emitter and collector regions.

Measurements have shown that the parasitic vertical PNP transistor has a very low (less than one) current gain. However, a vertical PNP requires effective vertical transistor action. Thus, in the prior art, the only solution was a vertical PNP structure without a buried layer.

In accordance with the present invention, it has been discovered that by using a "localized" buried layer and a deep sinker-type region (discussed below) to surround the emitter, the gain at high current is increased significantly with only a small degradation of the low current gain. The particular geometrical configuration of the localized buried layer, i.e., a grid configuration, is a compromise between two different requirements: the buried layer must have a minimum area so as to minimally affect the gain of the transistor, but at the same time, it must significantly decrease the base resistance. A good compromise is to fabricate the localized buried layer so that it covers about 20-30% of the area under the emitter. In that way, the gain at low current is reduced by the same amount, but the gain at high current is increased several times.

The preferred embodiment of the localized buried layer 20 is shown in FIG. 4b and consists of a series of parallel and transversal diffusions. The dopant concentration of these diffusions is on the order of $10^3$ higher than the epitaxial region (typically $10^{15}$). The localized buried layer 20 is formed directly below the region where the emitter 32 will be formed and preferably covers between twenty and thirty percent of the area below the emitter.

In FIG. 4c, an N-type epitaxial layer 12 is formed on top of substrate 10 and localized buried layer 20. A portion of the epitaxial layer 12 serves as the active base region 12'.

Figure 4D:
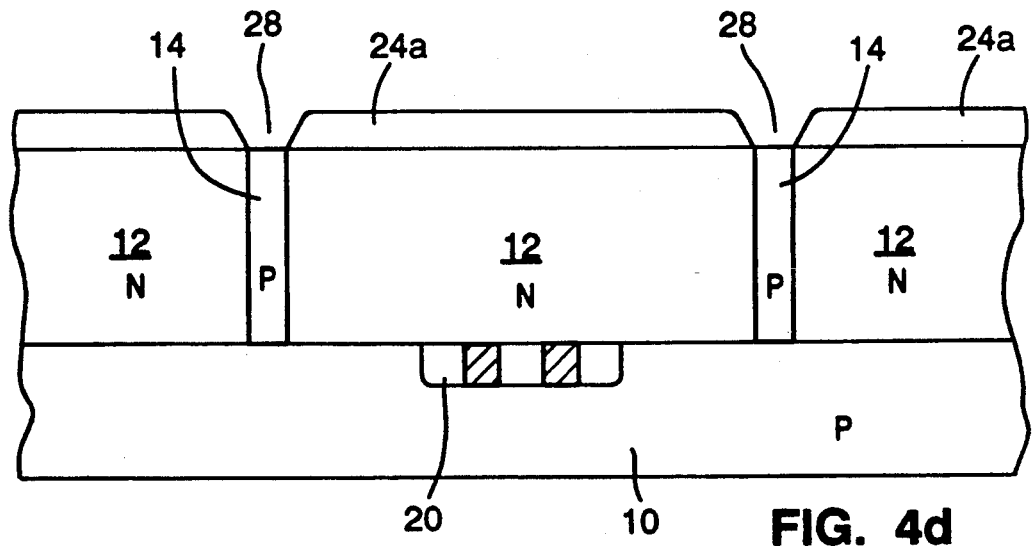

Referring now to FIG. 4d, a P-type impurity dopant is introduced at diffusion window 28 in oxide mask 24a to create isolation region 14. The isolation region 14 extends through the epitaxial layer 12 to the substrate 10 to created a "tub" which isolates the base and emitter regions of the vertical PNP transistor from other parts of the integrated circuit. Other devices may be fabricated in other tubs using the same substrate 10. The isolation region also provides a location for a connection to the collector 10 (see below) if needed.

Figure 4E:
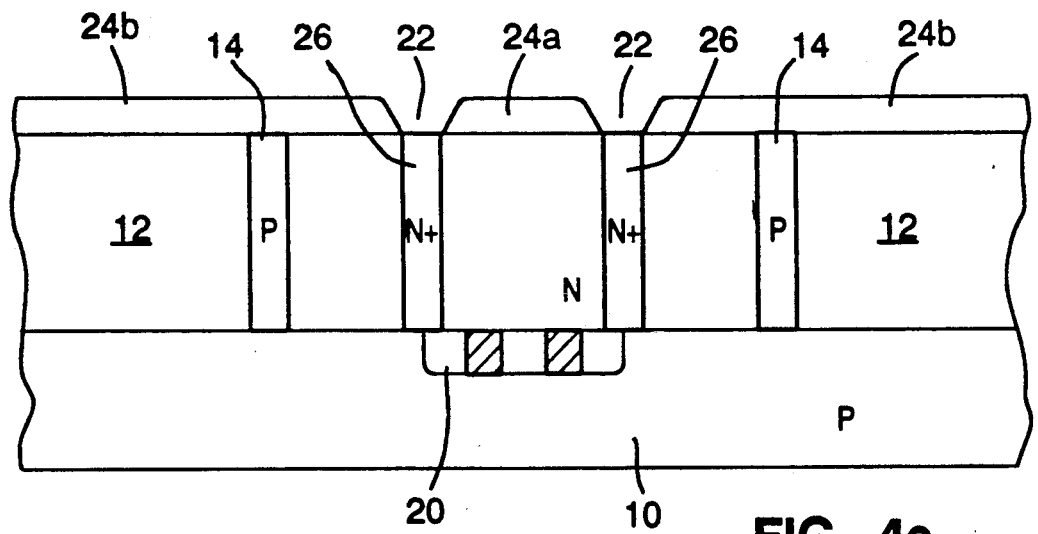

As shown in FIG. 4e, an N+-type impurity dopant is next introduced at diffusion window 22 in oxide mask 24b using a standard sinker process to create sinker region 26. The dopant concentration of this region is on the order of $10^4$ higher than the epitaxial region. The sinker region 26 extends through the epitaxial layer 12 to the substrate 10 making contact to and, in one embodiment of the present invention, completely surrounding the localized buried layer 20. The sinker region 26 also provides a location for connection to the base 12 (see below).

Figure 4F:
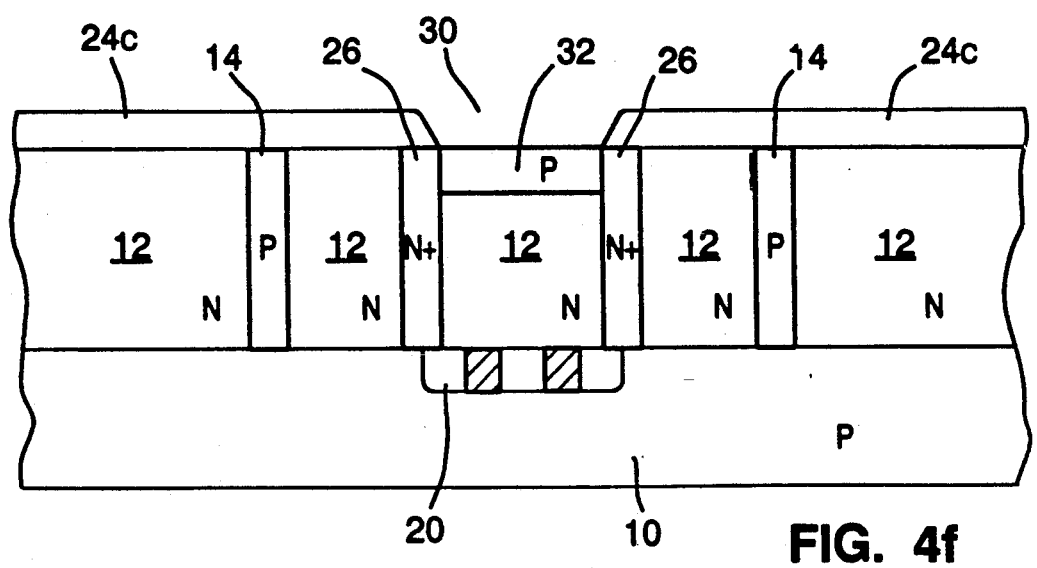

Referring now to FIG. 4f, a P-type impurity dopant is introduced through diffusion window 30 in oxide mask 24c to create the emitter region 32.

An additional masking step can be carried out (not shown) in which windows are opened up through an oxide over the isolation region (collector) 14, the sinker region (base) 26, and the emitter region 32, and electrical contact is made to the base, collector and emitter of the PNP transistor through a conventional process, such as metallization.

It has been discovered that while the transistor structure of the present invention exhibits some decrease in current gain compared to a conventional structure, it also exhibits a significant improvement in performance at high base drive levels. The decrease in current gain is inversely proportional to the amount of area under the emitter which is covered by the localized layer.

In one example, a structure A without a localized buried layer has a current gain $h_{fe}=200$. Further, structure A has a resistivity of 2 k$\Omega/\square$. In a structure B made according to the present invention, where the localized buried layer covers twenty percent of the area under the emitter, $h_{fe}=160$. Structure B has a resistivity of 100 $\Omega/\square$. The decrease in the gain of structure B is offset by a sharp decrease in the resistivity of the structure and an increase of the gain at high current. Thus, less silicon area is required to produce a specified gain at high currents, and smaller structures can be fabricated.

Figure 5A:
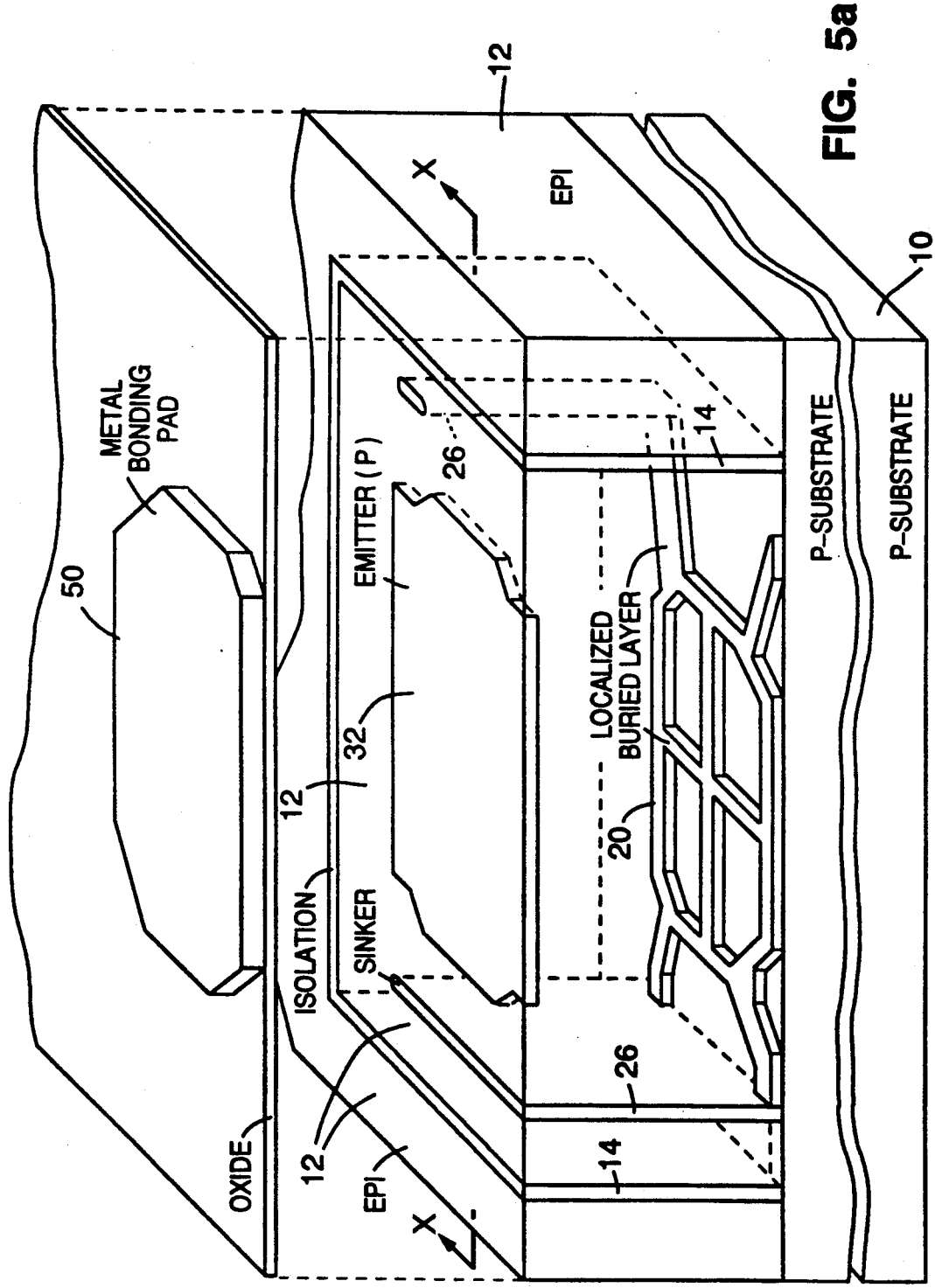
FIG. 5a is a perspective view of the preferred embodiment of a vertical PNP transistor according to the present invention.
Figure 5B:
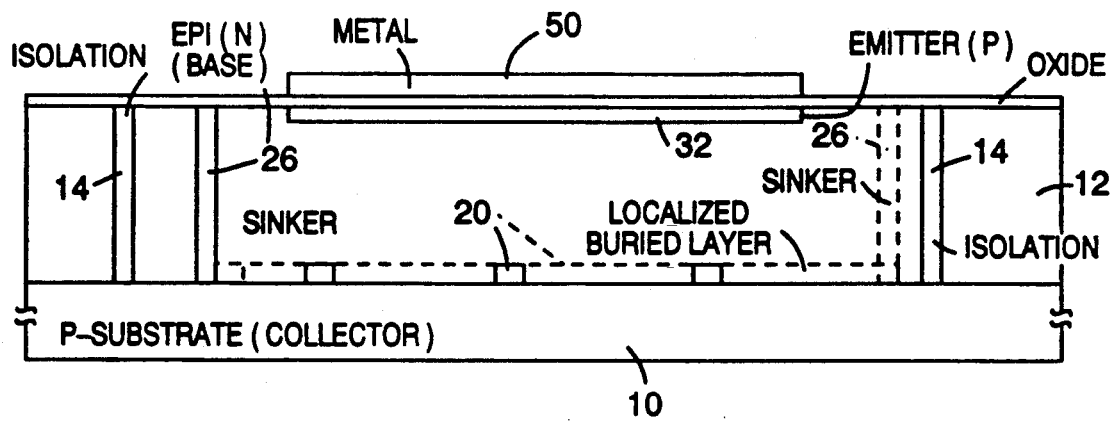
FIG. 5b is a sectional view of a vertical PNP transistor according to the present invention taken along the line X—X.
Figure 5C:
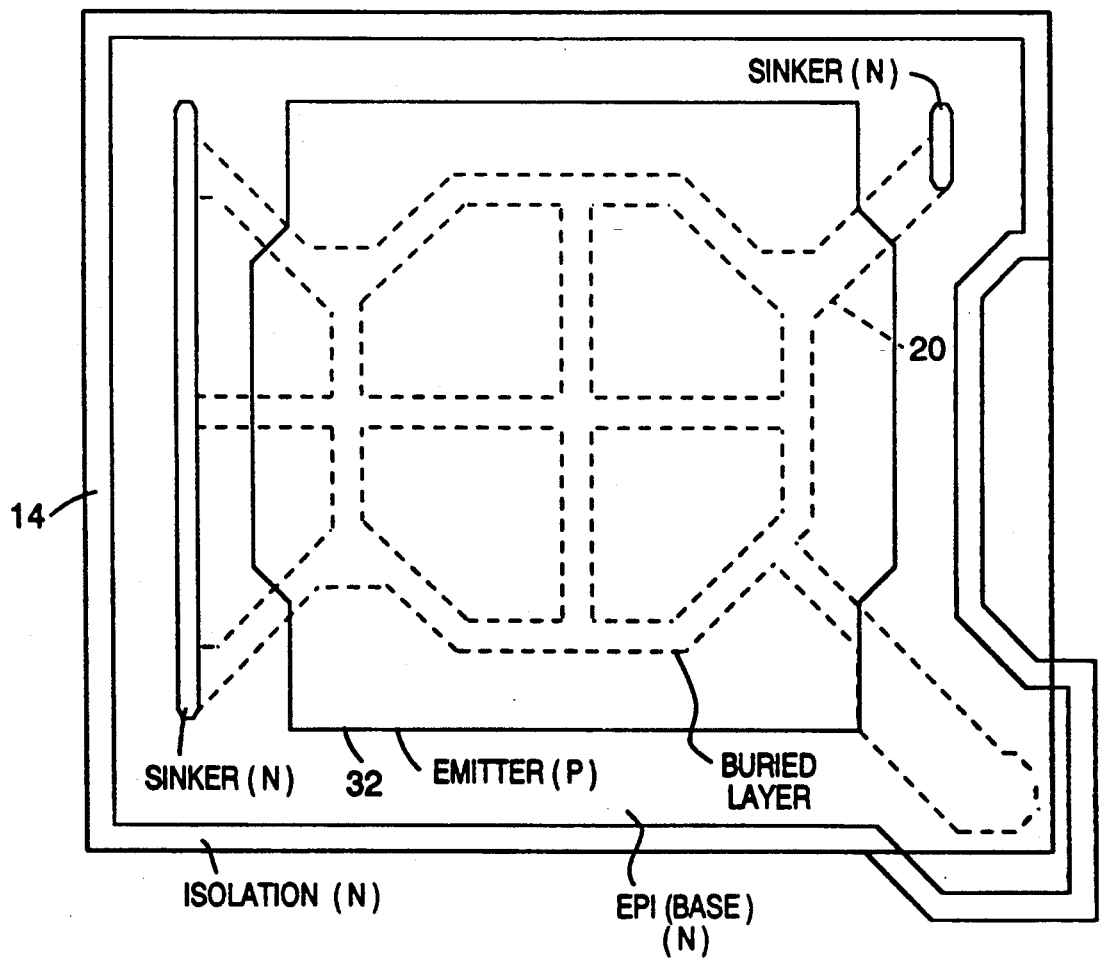
FIG. 5c is a top plan view of a vertical PNP transistor according to the present invention.

Referring now to FIGS. 5a through 5c, a preferred embodiment of the vertical PNP transistor of the present invention is shown. FIG. 5b is a cross-sectional view of the transistor taken along lines X—X of FIG. 5a. FIG. 5a is a perspective view of the transistor which has been exploded so that the various regions can be viewed more clearly. FIG. 5c is a top view of the transistor structure illustrating the orientation and sizing of the emitter region 32 of the transistor with respect to the localized buried layer 20.

As can be seen from FIG. 5a, in the embodiment of the present invention shown, the buried layer 20 is sandwiched between the epitaxial region 12 and the substrate region 10, directly under the emitter 32. Metal region 50 may or may not be used. Sinker region 26 is employed to provide a contact between localized buried layer 20 and the upper surface of the transistor. Referring to FIG. 5c it can be seen that in the preferred embodiment of the present invention localized buried layer 20 is in a "grid" configuration and covers approximately 30% of the area directly beneath the emitter. It can also be seen how sinker regions 26 extend from the plane containing the emitter region 32 down to a point where contact is made with localized buried layer 20. From FIG. 5c it can also be seen how isolation region 14 surrounds the vertical PNP structure of the present invention. It is to be understood that while this embodiment shows sinker regions which do not completely surround the emitter region 32, the present invention contemplates alternative embodiments in which the sinker regions completely surround the emitter region and the localized buried layer, and make contact with the localized buried layer.

Not shown in FIGS. 5a through 5c are conventional contacts to the emitter region 32, the sinker regions 26 (for contact to the base), and to the isolation regions 14 for contact to the collector of the vertical PNP transistor of the present invention.

It should be understood that the invention is not intended to be limited by the specifics of the above-described embodiment, but rather defined by the accompanying claims.

I claim:

1. A method for fabricating a vertical PNP transistor having a base, a collector, and an emitter on a substrate of a first conductivity-type material, wherein the substrate serves as the collector, comprising:
   a. forming a localized buried layer of an increased concentration of a second conductivity-type material on the substrate;
   b. forming an epitaxial layer of the second conductivity-type material on the substrate to serve as the base;
   c. forming an isolation region of the first conductivity-type material in the epitaxial layer which extends to the substrate to create a tub;
   d. forming a deep region of an increased concentration of the second conductivity-type material in the epitaxial layer which extends and connects to the localized buried layer and serves as a connection for the base of the vertical PNP transistor; and
   e. forming an emitter region of the first conductivity-type material on the epitaxial layer directly above the localized buried layer.

2. The method of claim 1, wherein the localized buried layer forming step includes the step of forming the localized buried layer in the shape of a grid.

3. The method of claim 1, wherein the localized buried layer forming step includes the step of forming the localized buried layer so that it covers more than twenty percent and less than thirty percent of the area under the emitter.

4. The transistor of claim 1, wherein the deep region surrounds the localized buried layer.

5. The transistor of claim 1, wherein the first conductivity-type material is a P-type material, and the second conductivity-type material is an N-type material.

6. The transistor of claim 1, wherein the localized buried layer is formed to have a concentration on the order of one thousand times higher than the epitaxial layer, and wherein the deep region is formed to have a concentration on the order of ten thousand times higher than the epitaxial layer.

* * * * *